(12) United States Patent
Price (10) Patent No.: US 9,586,531 B2
(45) Date of Patent: Mar. 7, 2017

(54) SHUTTERED LOUDSPEAKERS

(71) Applicant: Bose Corporation, Framingham, MA (US)

(72) Inventor: Carl J. Price, Marlborough, MA (US)

(73) Assignee: Bose Corporation, Framingham, MA (US)

(*) Notice: Subject to any disclaimer, the term of this patent is extended or adjusted under 35 U.S.C. 154(b) by 162 days.

(21) Appl. No.: 14/478,259

(22) Filed: Sep. 5, 2014

(65) Prior Publication Data
US 2016/0068112 A1    Mar. 10, 2016

(51) Int. Cl.
| | | |
|---|---|---|
| H04B 1/00 | (2006.01) | |
| B60R 11/02 | (2006.01) | |
| H04R 1/02 | (2006.01) | |
| H03F 3/181 | (2006.01) | |
| B60R 11/00 | (2006.01) | |

(52) U.S. Cl.
CPC .......... B60R 11/0217 (2013.01); H03F 3/181 (2013.01); H04R 1/02 (2013.01); H04R 1/023 (2013.01); B60R 2011/0022 (2013.01); H04R 2499/13 (2013.01)

(58) Field of Classification Search
CPC . H04R 1/02; H04R 1/345; H04R 9/06; H04R 2499/00; H04R 2499/01; H04R 2499/10; H04R 2499/13; H04R 2499/15; H03F 3/181; B60R 11/0217

USPC ......... 381/86, 160, 189, 302, 339, 347, 350, 381/386, 387, 391, 395; 181/176
See application file for complete search history.

(56) References Cited

U.S. PATENT DOCUMENTS

| | | | | |
|---|---|---|---|---|
| 6,160,896 A | * | 12/2000 | Macaluso | H04M 1/19 381/386 |
| 7,702,123 B2 | | 4/2010 | Soerensen | |
| 2009/0046210 A1 | * | 2/2009 | Sakamoto | H04L 12/2809 348/738 |
| 2010/0220053 A1 | * | 9/2010 | Ishii | B60K 37/06 345/156 |
| 2010/0302397 A1 | * | 12/2010 | Huang | G06T 7/2053 348/222.1 |
| 2013/0028457 A1 | * | 1/2013 | Yeh | H04R 1/10 381/334 |
| 2015/0340795 A1 | * | 11/2015 | Lee | G06F 1/1656 381/334 |

* cited by examiner

*Primary Examiner* — Vivian Chin
*Assistant Examiner* — William A Jerez Lora
(74) *Attorney, Agent, or Firm* — Bose Corporation (57) ABSTRACT

A loudspeaker includes an electro-acoustic transducer for converting electrical audio signals into sound waves, and a housing that supports the electro-acoustic transducer. The loudspeaker also includes a shutter that is supported by the housing and is displaceable between a first, closed position in which the shutter substantially covers the transducer, and a second, open position in which the transducer is exposed.

24 Claims, 9 Drawing Sheets

SHUTTERED LOUDSPEAKERS

BACKGROUND

This disclosure relates to shuttered loudspeakers.

It is known to provide loudspeakers with movable parts. An example of this is the use of so called "pop-up" speakers in automotive vehicles. Such pop-up speakers are known to rise out of an interior surface of the vehicle when active, and retract back into the vehicle surface when inactive.

While the use of such loudspeakers may provide an intriguing visual effect, the fact that the loudspeakers are movable may not necessarily benefit the acoustic aspects of the loudspeaker. Furthermore, since these pop-up speakers often extend outwardly from an interior surface of a vehicle, they may reduce visibility when in the active, extended state.

SUMMARY

In one aspect, a loudspeaker includes an electro-acoustic transducer for converting electrical audio signals into sound waves, and a housing that supports the electro-acoustic transducer. The loudspeaker also includes a shutter that is supported by the housing and is displaceable between a first, closed position in which the shutter substantially covers the transducer, and a second, open position in which the transducer is exposed.

Implementations may include one of the following features, or any combination thereof.

In some implementations, the loudspeaker does not include a grille for protecting the transducer.

In certain implementations, the shutter includes at least one moveable blade.

In some examples, the shutter includes at least one rotatable blade.

In certain examples, the loudspeaker also includes an electric motor, and displacement of the shutter is driven by the electric motor.

In some cases, the loudspeaker also includes control electronics coupled to the electric motor. The control electronics are configured to receive a signal indicative of a power state of an associated audio system, and drive the electric motor in response to the signal.

In some implementations, the control electronics include a processor coupled to the electric motor, and instructions stored on a non-transitory computer-readable media. The instructions, when executed, cause the processor to receive a signal indicative of a power state of an associated audio system; and drive the electric motor in response to signal. The instructions, when executed, may cause the processor to drive the electric motor to open the shutter to expose the electro-acoustic transducer when the processor receives a signal indicating that the associated audio system has been powered on. Alternatively or additionally, the instructions, when executed, cause the processor to drive the electric motor to close the shutter when the processor receives a signal indicating that the associated audio system has been powered off.

In certain implementations, the loudspeaker also includes a proximity detector for detecting the presence of an object in proximity the electro-acoustic transducer. The loudspeaker is configured to displace the shutter to the first, closed position in response to detecting the presence of an object in proximity to the electro-acoustic transducer.

In some examples the loudspeaker also includes a proximity sensor for detecting the presence of an object in proximity to the electro-acoustic transducer, an electric motor for driving displacement of the shutter, and control electronics that are coupled to the proximity sensor and to the electric motor. The control electronics are configured to drive the electric motor to close the shutter when the control electronics receive a signal from the proximity sensor indicating that an object is in proximity to the electro-acoustic transducer.

In certain examples, the control electronics include a processor that is coupled to the proximity sensor and to the electric motor, and instructions stored on a non-transitory computer-readable media. The instructions, when executed, cause the processor to drive the electric motor to close the shutter when the processor receives a signal from the proximity sensor indicating that an object is in proximity to the electro-acoustic transducer. The instructions, when executed, may also cause the processor to automatically shut the electro-acoustic transducer off, such that no audio is rendered via the electro-acoustic transducer, until the shutter opens up again.

In some cases, the shutter comprises a mechanical iris comprising a plurality of overlapping blades which are displaceable to open and close an aperture formed by the blades.

In certain cases, wherein the loudspeaker is configured such that the shutter automatically opens when an associated audio system is powered on and automatically closes when the associated audio system is powered off.

In some implementations, the shutter is further displaceable between the second, open position and a third, open position, and the loudspeaker is configured such that the shutter moves between the second, open position and the third, open position in response to changes in audio volume.

In certain implementations, the loudspeaker is configured such that an aperture defined by the shutter increases in response to an increase in audio volume.

In another aspect, a vehicle audio system includes a plurality of loudspeakers, a head unit, and an audio amplifier for amplifying and filtering entertainment audio received from the head unit for distribution to a plurality of speakers positioned about the vehicle cabin. At least one of the plurality of loudspeakers is a shuttered loudspeaker that includes an electro-acoustic transducer for converting electrical audio signals into sound waves, a housing that supports the electro-acoustic transducer, and a shutter that is supported by the housing and is displaceable between a first, closed position in which the shutter substantially covers the transducer, and a second, open position in which the transducer is exposed.

Implementations may include one of the above and/or below features, or any combination thereof.

In some implementations, the shuttered loudspeaker is disposed on an A-pillar in a vehicle cabin.

In certain implementations, the shuttered loudspeaker also includes an electric motor for driving displacement of the shutter, and a control electronics coupled to the electric motor. The control electronics are configured to drive the electric motor to control displacement of the shutter in response to signals received from the audio amplifier.

In some examples, the control electronics includes a processor coupled to the electric motor, and instructions stored on a non-transitory computer-readable media. The instructions, when executed, cause the processor to drive the electric motor to control displacement of the shutter in response to signals received from the audio amplifier.

In certain examples, the shuttered loudspeaker also includes a proximity sensor for detecting the presence of an object near the electro-acoustic transducer, an electric motor for driving displacement of the shutter, and control electronics coupled to the proximity sensor and to the electric motor. The control electronics are configured to drive the electric motor to close the shutter when the control electronics receives a signal from the proximity sensor indicating that an object is near the electro-acoustic transducer.

In some cases, the control electronics include a processor coupled to the proximity sensor and to the electric motor, and instructions stored on a non-transitory computer-readable media The instructions, when executed, cause the processor to drive the electric motor to close the shutter when the processor receives a signal from the proximity sensor indicating that an object is near the electro-acoustic transducer. The instructions, when executed, may also cause the processor to automatically shut the electro-acoustic transducer off, such that no audio is rendered via the electro-acoustic transducer, until the shutter opens up again.

In certain cases, the shutter includes a mechanical iris that includes a plurality of overlapping blades which are displaceable to open and close an aperture formed by the blades.

DETAILED DESCRIPTION

Figure 1A:
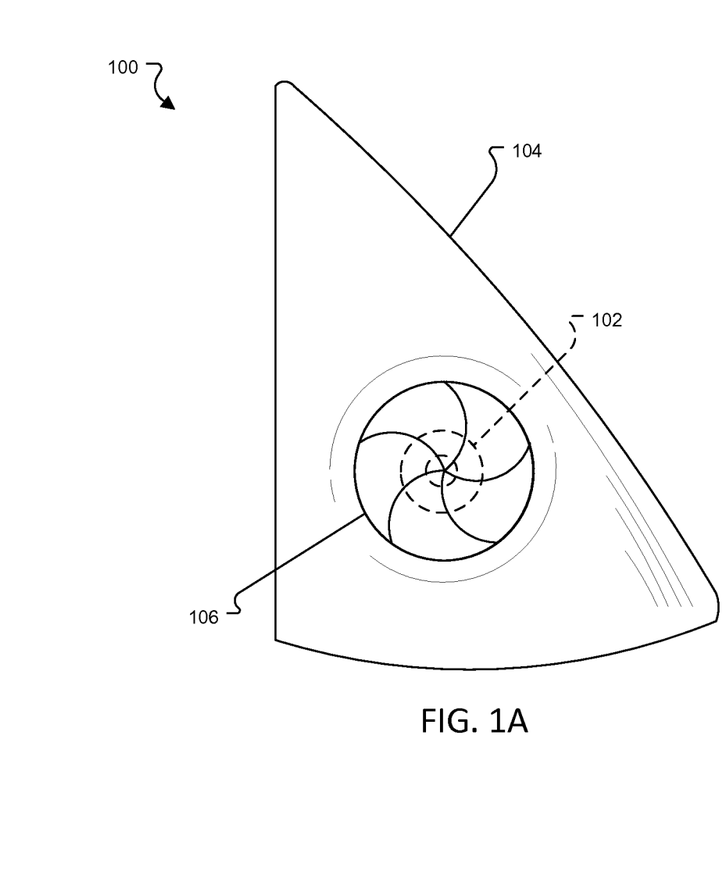
FIGS. 1A and 1B are front elevation views of a shuttered loudspeaker including a mechanical iris in a closed and an open position, respectively.
Figure 1B:
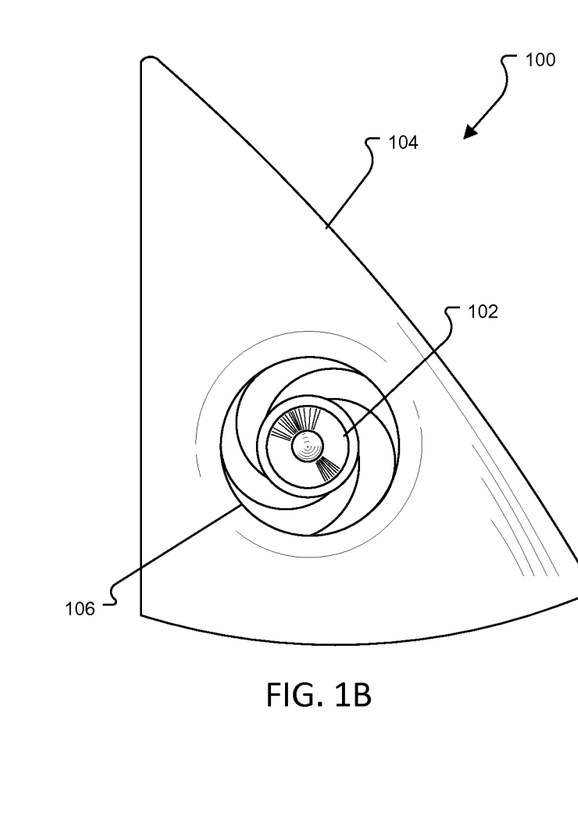

Referring to FIGS. 1A and 1B, a shuttered loudspeaker 100 includes an electro-acoustic transducer 102 which is mounted in a housing 104. A shutter 106 is mounted to the housing 104 coincident with the electro-acoustic transducer 102. The shutter 106 is displaceable between a first position (FIG. 1A) in which the shutter 106 is closed and substantially covers the electro-acoustic transducer 102 (i.e., in the closed state the shutter covers at least 90%, e.g., 95%-100%, of the radiating surface of the electroacoustic transducer), and a second position (FIG. 1B) in which the shutter 106 is open to expose the electro-acoustic transducer 102 in the housing 104.

The shuttered loudspeaker 100 is configured such that the shutter 106 opens automatically when the shuttered loudspeaker 100, or an associated audio system, is powered on and closes automatically when the shuttered loudspeaker 100, or the associated audio system, is powered off. This provides a protective cover for the electro-acoustic transducer 102, which can help to inhibit damage to the electroacoustic transducer, while the shuttered loudspeaker 100 is powered off. The protection offered by the shutter 106 can allow the loudspeaker 100 to operate without the need for a grille to protect the electro-acoustic transducer 102. This can allow the shuttered loudspeaker 100 to operate with 100% acoustic transparency by completely exposing a front radiating surface of the electro-acoustic transducer 102. This can provide a benefit over conventional loudspeakers with grille covered transducers, which may only achieve 30% to 40% acoustic transparency.

Figure 2:
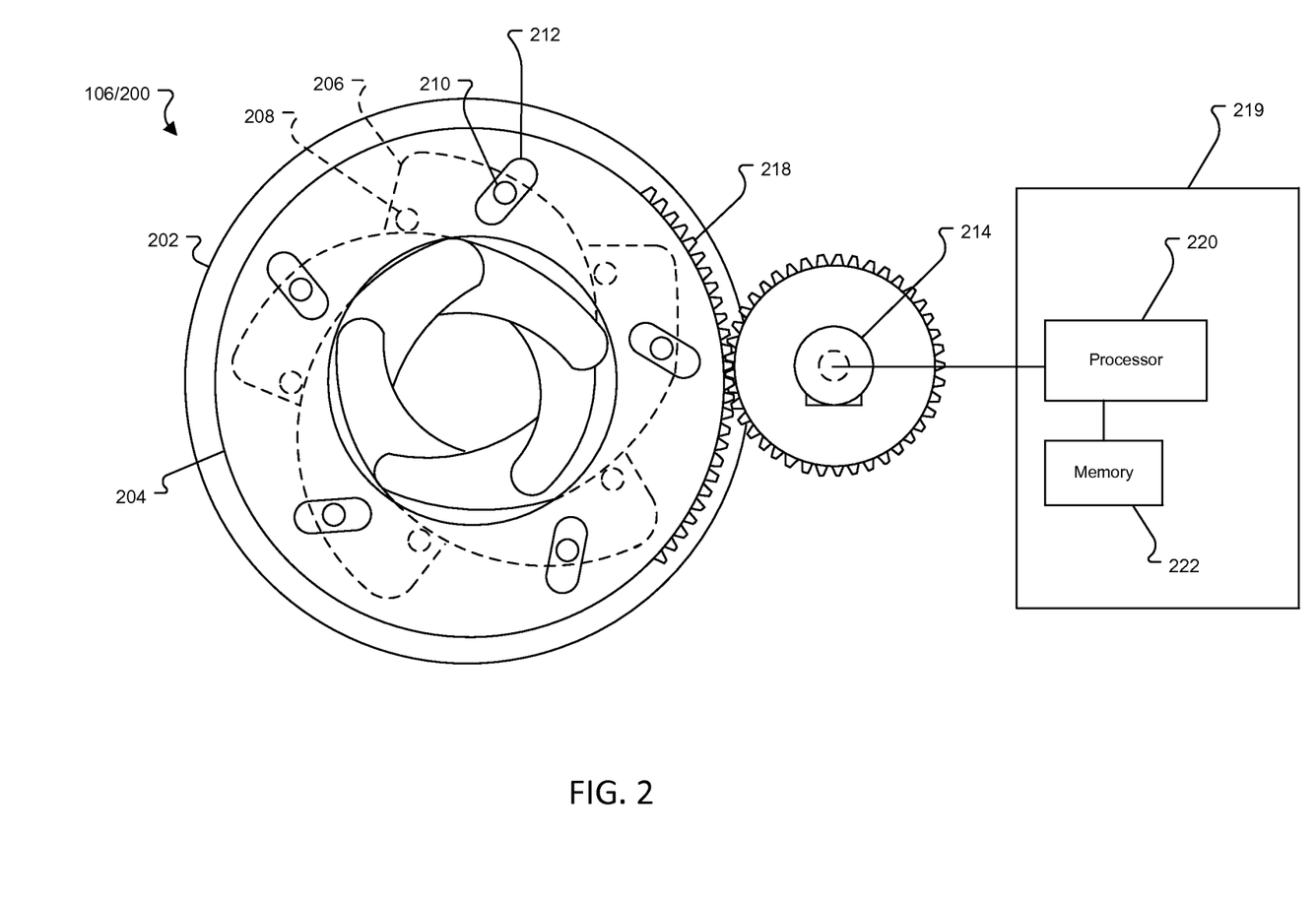
FIG. 2 illustrates the mechanical iris, and associated control electronics, from the shuttered loudspeaker of FIG. 1A.

In one example, the shutter 106 is in the form of a mechanical iris. As illustrated in FIG. 2, an exemplary mechanical iris 200 includes a base ring 202, a blade actuating ring 204, and a plurality of blades 206. Each iris blade 206 is pivotally attached to the base ring 202 by a pivot pin 208. Each of the blades 206 also includes a slider pin 210 which is received in a corresponding slot 212 in the blade actuating ring 204. The base ring 202 is fixedly attached to the housing 104 (FIG. 1) and the blade actuating ring 204 is rotatable relative to the base ring 202.

The mechanical iris 202 is opened or closed by rotating the blade actuating ring 204 around the center while the base ring 202 is held stationary via its connection to the housing 104 (FIG. 1). The rotation of the blade actuating ring 204 relative to the base ring 202 causes the slider pins 210 to slide within the slots 212 in the blade actuator ring 204, which, in turn, causes the blades 206 to pivot about their respective pivot pins 208.

Motion of the blades 206 can be driven by an electric motor 214. In the illustrates example, the electric motor 214 drives a gear 216, which, in turn, engages a set of gear teeth 218 along the outer peripheral edge of the blade actuating ring 204 to drive motion of the blade actuating ring 204.

Control electronics 219 including a processor 220 and associated memory 222 (e.g., non-volatile memory, e.g., ROM) are provided for controlling operation of the electric motor 214. Instructions stored on the memory, when executed by the processor 220, cause the processor to: receive a signal (e.g., from an associated audio amplifier or tuner/receiver) indicative of a power state of an associated audio system, and to drive the electric motor 214 in response to signal. For example, the instructions will cause the processor 220 to drive the electric motor 214 to open the shutter 106 to expose the electro-acoustic transducer 102 (FIG. 1B) when the processor 220 receives a signal indicating that the associated audio system has been powered on. And, the instructions will cause the processor 220 to drive the electric motor 214 to close the shutter 106 when the processor 220 receives a signal indicating that the associated audio system has been powered off. In some cases, the control electronics 219 may be housed within another component (e.g., an audio amplifier, or receiver) of an associated audio system.

Figure 3A:
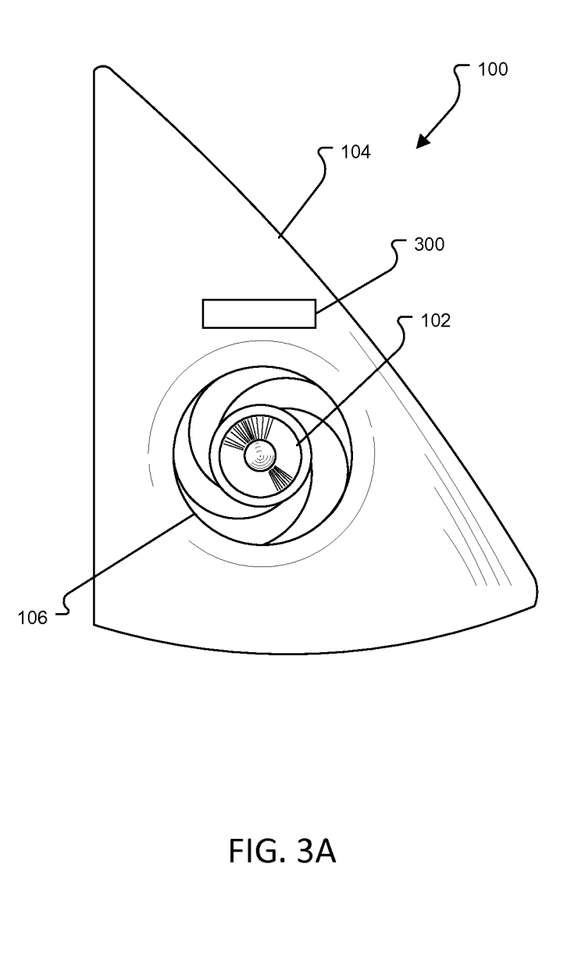
FIG. 3A is a front elevation view of a shuttered loudspeaker having a proximity detector.
Figure 3B:
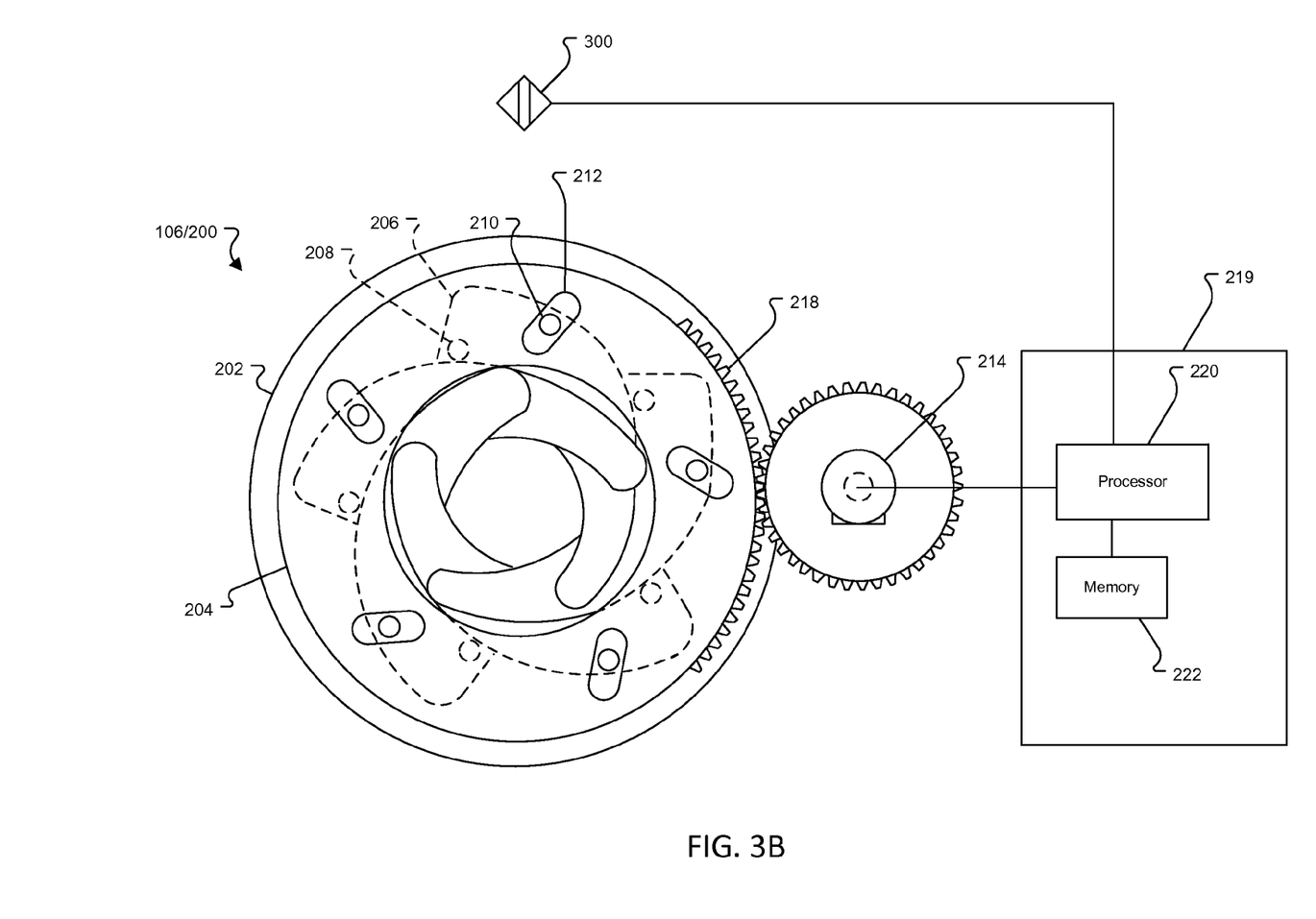
FIG. 3B illustrates a mechanical iris, and associated circuitry, from the shuttered loudspeaker of FIG. 3A.

With reference to FIGS. 3A and 3B, further protection can be provided by incorporating a proximity sensor 300 into the loudspeaker 100. The proximity sensor 300 can be used to allow the shuttered loudspeaker 100 to detect an object, such as a person's hand, approaching the exposed surface of the electro-acoustic transducer 102. The proximity sensor 300 may include one or more IR detectors mounted on the housing 104.

The shuttered loudspeaker 100 can be configured such that, in response to detecting something approaching the electro-acoustic transducer 102, the shutter 106 closes to protect the transducer 102. For example, the instructions stored on the memory 222 (FIG. 3B) may cause the processor 220 to drive the electric motor 214 to close the shutter 106 when the processor 220 receives a signal from the proximity sensor 300 indicating that an object is near or approaching the electro-acoustic transducer 102. This can help to prevent an approaching object from contacting, and potentially damaging, the electro-acoustic transducer 102. This may be particularly beneficial for automotive applications, where the shutter 106 can be used to protect the electro-acoustic transducer 102 from flying debris in the event of an abrupt acceleration or a crash.

In some cases, the instructions may also cause the processor 220 to automatically shut the electro-acoustic transducer 102 off until the shutter 106 opens up again (e.g., when the object/threat is no longer present). This can be used to help provide an audible feedback to indicate that a problem has been detected. For example, the control electronics 219 may control a switch to power the electro-acoustic transducer 102 on and off. Alternatively or additionally, the control electronics 219 may be configured to communicate the detection of an object, and/or the closing of the shutter 106, to another audio system component, such an audio amplifier or receiver, to control operation of the electro-acoustic transducer 102.

Figure 4:
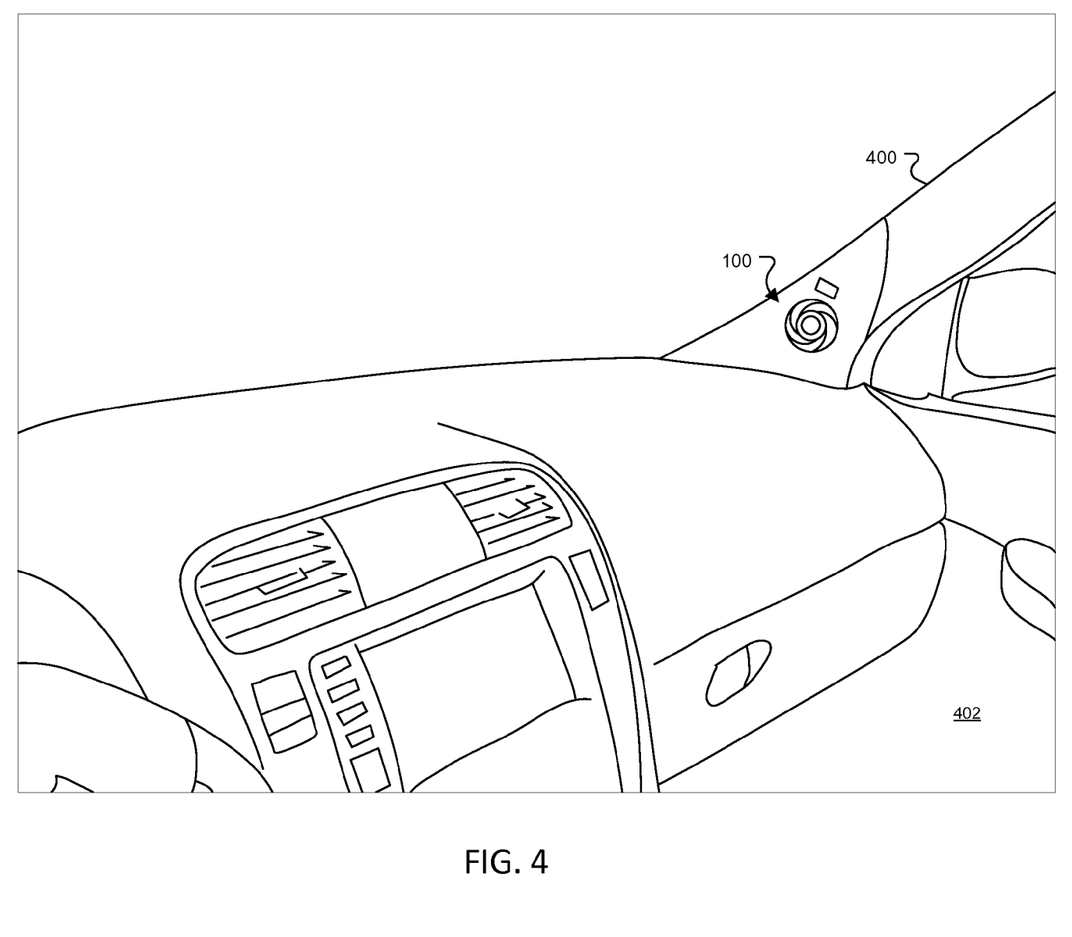
FIG. 4 illustrates the shuttered loudspeaker of FIG. 3A installed on an A-pillar in a vehicle's passenger cabin.

FIG. 4 illustrates the shuttered loudspeaker 100 employed in a vehicle as part of the vehicle's audio system. Specifically, in the implementation illustrated in FIG. 4, the shuttered loudspeaker 100 is utilized as a tweeter positioned on an A-pillar 400 in a passenger compartment 402 of a vehicle. As used herein, "A-pillars" are the structural members (columns) of a vehicle that are along the left and right sides of the front windshield. This configuration provides a benefit over tradition pop-up speakers, which could pose a visual obstruction if integrated on a vehicle's A-pillar 400, while still providing a visual impression of motion associated with the shuttered loudspeaker 100. However, in the illustrated configuration, the tweeters are small enough to be incorporated into the A-pillar 400, and, since the tweeters do not rise out of the interior surface of the vehicle, they do not present a visual obstruction when in use.

Figure 5:
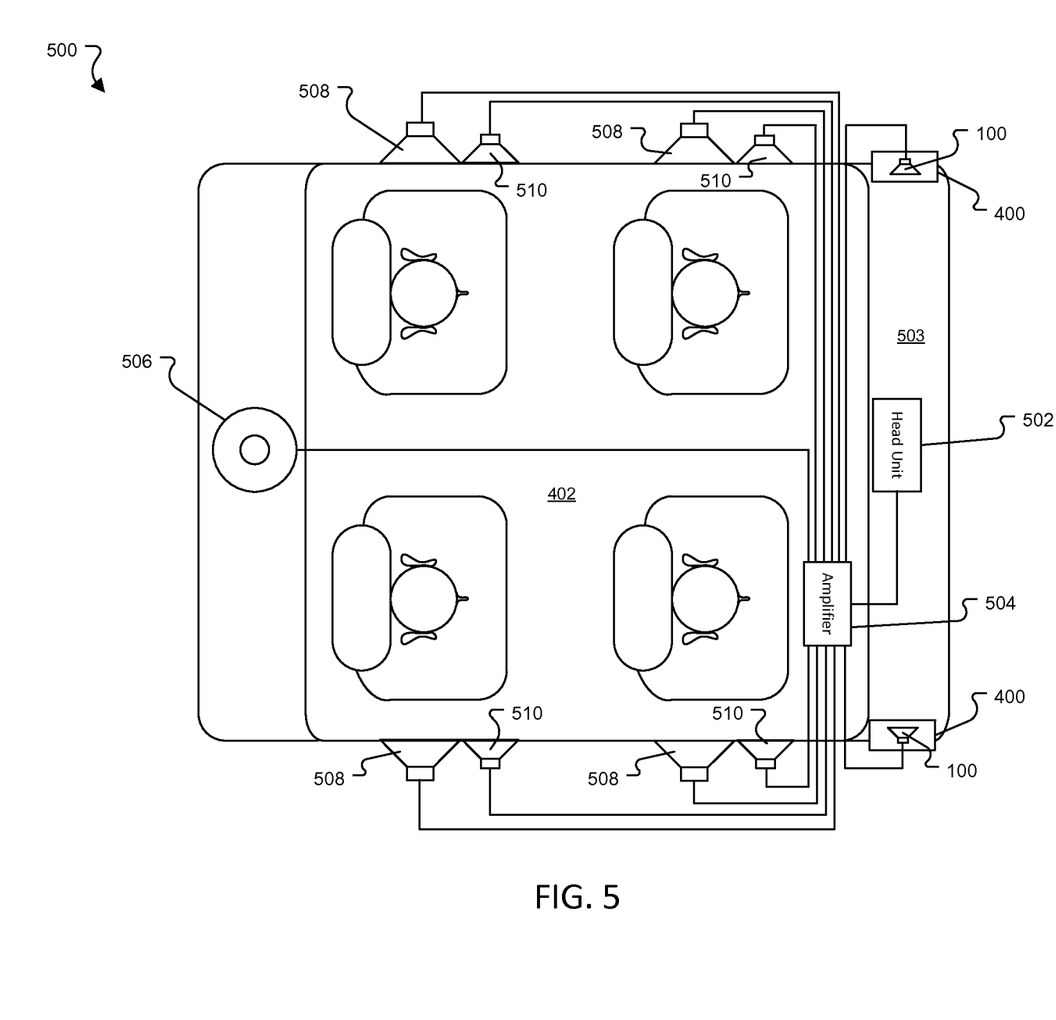
FIG. 5 is a schematic representation of a vehicle audio system including the shuttered loudspeakers of FIG. 3A.

An example of such a vehicle audio system 500 is illustrated in FIG. 5. The system 500 includes a head unit 502 which is typically positioned in the dash board 503 of a vehicle. The head unit 502 provides entertainment audio to an audio amplifier 504, which, in some cases, may be positioned underneath one of the vehicle's seats. The audio amplifier 504 amplifies and filters the entertainment audio for distribution to a plurality of speakers positioned about the vehicle cabin 402. In some cases, the functions of the amplifier and the head unit may be packaged in a common housing.

In this example, the plurality of speakers includes a subwoofer 506 for reproducing low frequency sounds in the range of about 20 Hz to about 200 Hz. The subwoofer 506 is positioned behind the vehicle's rear seats (e.g., in a package shelf of the passenger cabin). Woofers 508 for reproducing sounds in the 40 Hz to 1 kHz range, and mid-range speakers 510, for reproducing sounds in the 300 Hz to 5 kHz frequency range, are arranged in the front and rear doors, and a pair of tweeters implemented in the form of shuttered loudspeakers 100, as described above, positioned in the vehicle's A-pillars 400. Wiring connects the head unit 502 to the amplifier 504 and the amplifier to the plurality of speakers. Additional wires may be provided between the amplifier 504 and the shuttered loudspeakers 100 in order to control the movement of the shutters 106 (FIG. 1A).

The shuttered loudspeakers 100 can be configured such that their respective shutters 106 (FIG. 1A) open in response to a signal from the amplifier 504 indicating that the audio system 500 has been powered on. Likewise, the shuttered loudspeakers 100 can be configured such that their respective shutters 106 (FIG. 1A) close in response to a signal from the amplifier 504 indicating that the audio system 500 has been powered off.

Additionally, the shuttered loudspeakers 100 may also be configured with proximity detection, such as described above with respect to FIGS. 3A and 3B, such that the shutter 106 (FIG. 1A) closes if an object is detected in proximity the associated one of the shuttered loudspeakers 100. The shutter 106 (FIG. 1A) may remain closed until the object is no longer detected. In such cases, the audio system 500 may be configured to shut down audio from the associated shuttered loudspeaker 100 until the shutter 106 opens up again.

In some cases, in response to the detection of an object in close proximity to one of the shuttered loudspeakers 100, the audio system 500 may be configured to shut down all high frequency audio, and, in some examples, even shut down the midrange audio, until the shutter 106 opens up again. This shutting down of audio can help to provide the user with audible feedback to indicate that the loudspeaker 100 sensed a threat. This can be beneficial, for example, if a person attempts to touch the electro-acoustic transducer 102 (FIG. 1B) while it is operating. In response, the shutter 106 (FIG. 1A) closes and the audio system 500 produces only low frequency components of the audio signal to provide an audible indication that a problem has been detected.

Other Implementations

In some cases, the shutter may be displaceable from a first, closed position to a second, open position, e.g., on power up, and may be further displaceable between the second, open position and a third, open position. For example, the opening (a/k/a "aperture") defined by the shutter may increase when the audio volume increases. To avoid interfering with the operation of the electro-acoustic transducer, the opening may be larger than the electro-acoustic transducer in the second, open position and may increase in size as the volume of audio rendered by the loudspeaker increases, such that the entire front radiating surface of the electro-acoustic transducer remains exposed so long as the loudspeaker remains powered on.

Figure 6A:
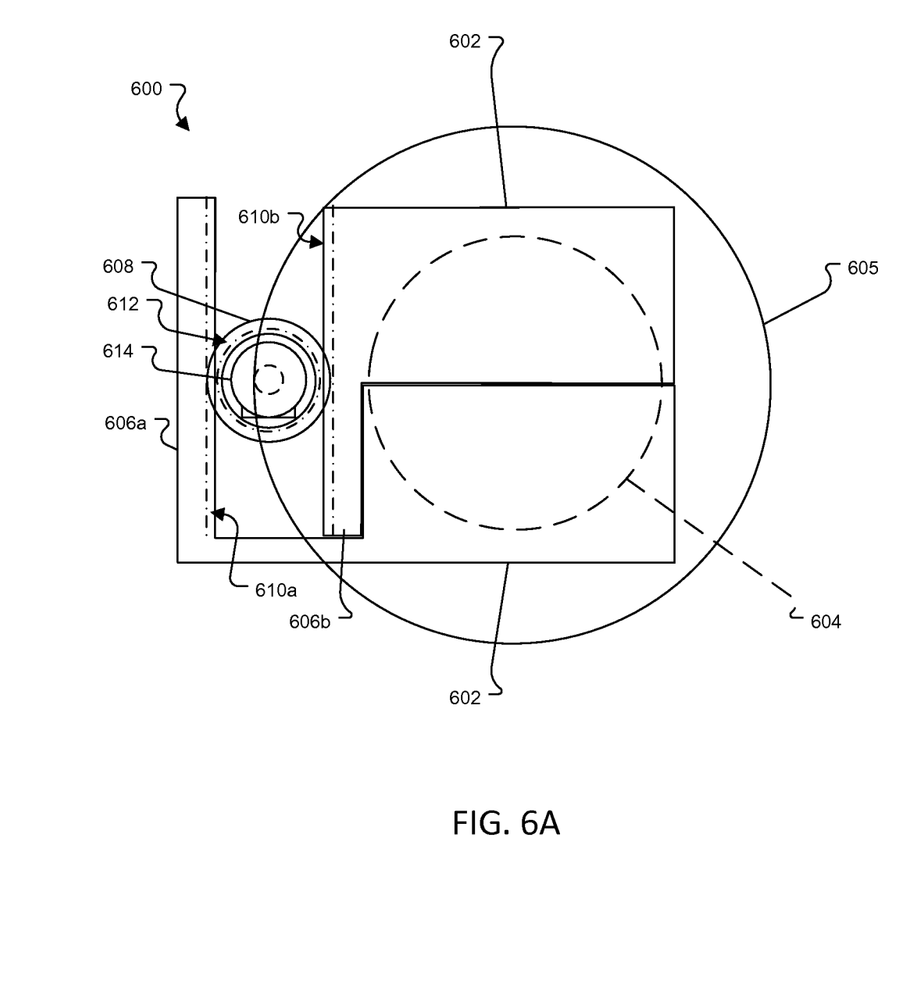
FIGS. 6A and 6B illustrate an alternative shutter configuration in a closed and open position, respectively.
Figure 6B:
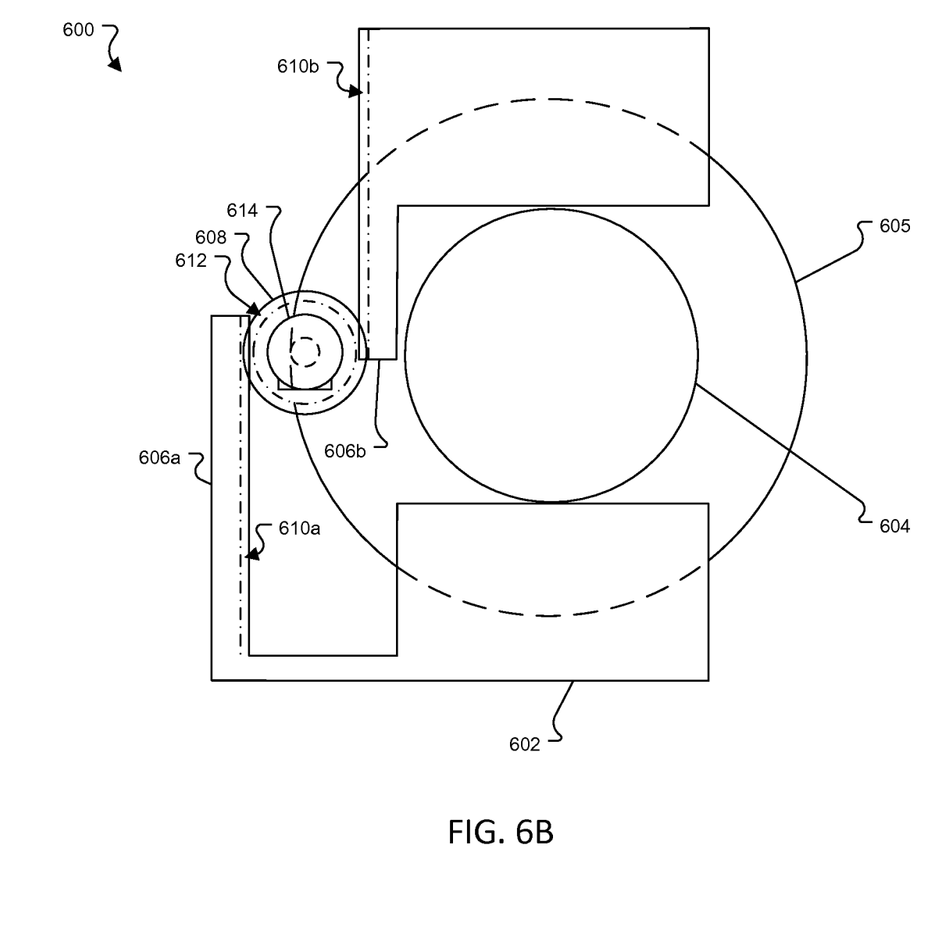

While an exemplary shuttered loudspeaker has been described in which the shutter takes the form of a mechanical iris, other implementations are possible. For example, In still other implementations, the shutter may include one or more blades that travel along a linear path to cover and uncover an aperture aligned with the electro-acoustic transducer. For example, FIGS. 6A and 6B illustrate an implementation of a shutter 600 which includes a pair of blades 602 that move linearly to cover (FIG. 6A) and to expose (FIG. 6B) an aperture 604 in a base ring 605. The base ring 605 is fixedly attached to the loudspeaker housing (not shown). Motion of the two blades 602 are linked through a pair of racks 606a, 606b and a pinion gear 608 disposed therebetween. A first rack 606a is attached to a first one of the blades 602, and a second rack 606b is attached to a second one of the blades 602. Gear teeth 610a, 610b on the racks 606a, 606b engage mating teeth 212 on the pinion gear 608. Motion of the shutter 600 can be driven by driving the pinion gear 608 with a rotary electric motor 614. Alternatively, motion of the shutter 600 can be driven by driving one of the blades 602 along a linear path with a linear motor (not shown). While two blades are illustrated in FIGS. 6A and 6B, a shutter comprising a single blade (e.g., a pinion gear driving a single blade to cover/uncover an aperture) is also possible.

Figure 7:
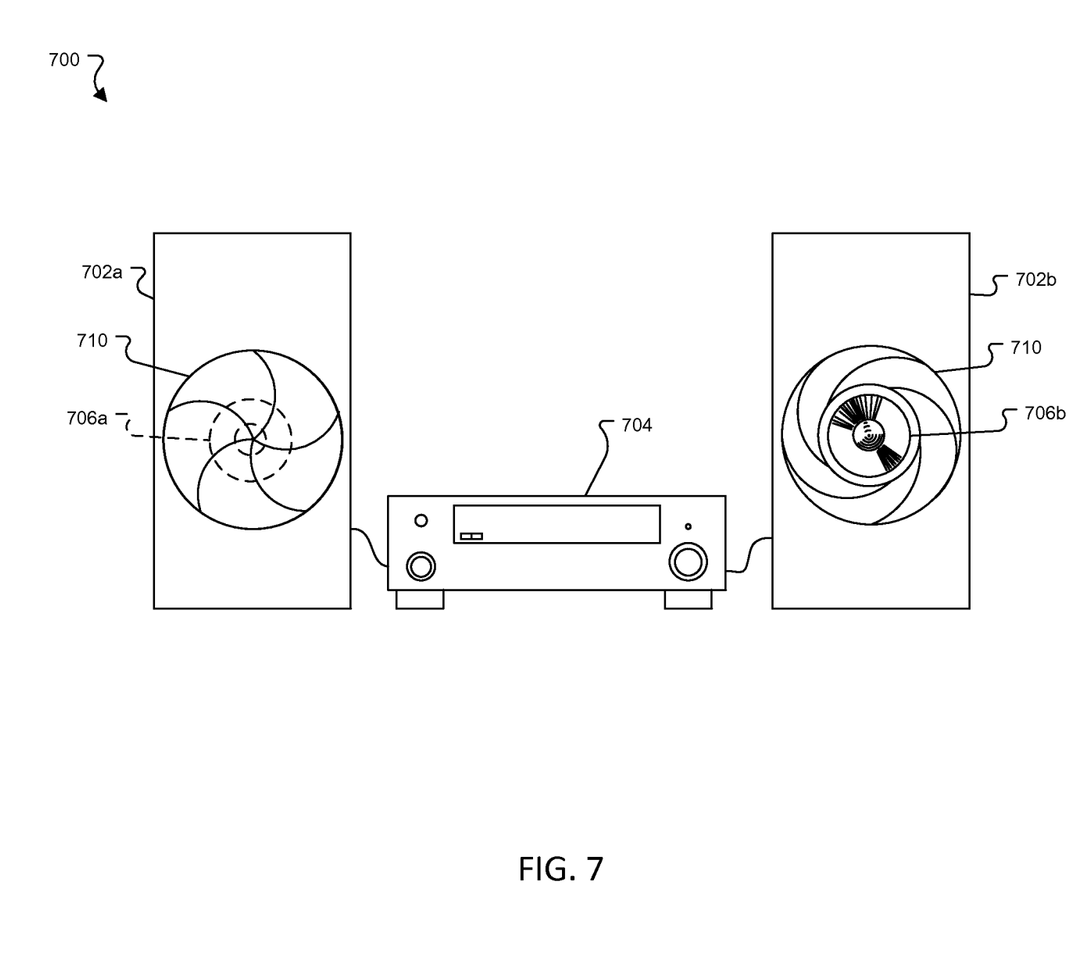
FIG. 7 illustrates a home entertainment system which includes shuttered loudspeakers.

Although an implementation has been described in which a shuttered loudspeaker is incorporated in a vehicle audio system, the shuttered loudspeakers herein may be utilized in other audio systems. For example, FIG. 7 illustrates a home entertainment system 700 that includes a pair shuttered loudspeakers 702a, 702b which are connected to a receiver 704 (a/k/a tuner). For purposes of illustration, the left-hand loudspeaker 702a is shown in the first, closed position in which the electro-acoustic transducer 706a is covered, and the right-hand loudspeaker 702b is shown in the second, open position in which the electro-acoustic transducer 706b is exposed. In the example illustrated in FIG. 7, the loudspeakers 702a, 702b include mechanical iris type shutters 710; however, the shutters 710 may take any of the forms discussed above.

The loudspeakers 702a, 702b are configured such that their respective shutters 710 open in response to the loudspeaker 704 receiving a signal from the receiver 704. In that regard, the loudspeakers 702a, 702b may each be equipped with control electronics, such as described above, for controlling operation of the shutters 710. Alternatively, the receiver 704 may include control electronics for controlling the operation of the shutters 710.

In some cases, the loudspeakers 702a, 702b may be provided with proximity sensors, such as described above with respect to FIGS. 3A and 3B, which can be used to close the shutters 710 if an object is detected near one of the electro-acoustic transducers 706a, 706b.

A number of implementations have been described. Nevertheless, it will be understood that additional modifications may be made without departing from the scope of the inventive concepts described herein, and, accordingly, other implementations are within the scope of the following claims.

What is claimed is:

1. A loudspeaker comprising:
an electro-acoustic transducer for converting electrical audio signals into sound waves;
a housing supporting the electro-acoustic transducer;
a shutter supported by the housing and displaceable between a first, closed position in which the shutter substantially covers the transducer, and a second, open position in which the transducer is exposed; and
a proximity detector for detecting an object approaching the electro-acoustic transducer, wherein the loudspeaker is configured to displace the shutter to the first, closed position in response to detecting the object approaching the electro-acoustic transducer.

2. The loudspeaker of claim 1, wherein the loudspeaker does not include a grille for protecting the transducer.

3. The loudspeaker of claim 1, wherein the shutter comprises at least one moveable blade.

4. The loudspeaker of claim 1, wherein the shutter comprises at least one rotatable blade.

5. The loudspeaker of claim 1, further comprising an electric motor, wherein displacement of the shutter is driven by the electric motor.

6. The loudspeaker of claim 5, further comprising control electronics coupled to the electric motor, wherein the control electronics are configured to receive a signal indicative of a power state of an associated audio system; and to drive the electric motor in response to the signal.

7. The loudspeaker of claim 6, wherein the control electronics comprise:
a processor coupled to the electric motor; and
instructions stored on a non-transitory computer-readable media that, when executed, cause the processor to:
receive a signal indicative of a power state of an associated audio system; and
drive the electric motor in response to signal.

8. The loudspeaker of claim 7, wherein the instructions, when executed, cause the processor to drive the electric motor to open the shutter to expose the electro-acoustic transducer when the processor receives a signal indicating that the associated audio system has been powered on.

9. The loudspeaker of claim 7, wherein the instructions, when executed, cause the processor to drive the electric motor to close the shutter when the processor receives a signal indicating that the associated audio system has been powered off.

10. The loudspeaker of claim 1, further comprising:
an electric motor for driving displacement of the shutter; and
control electronics coupled to the proximity sensor and to the electric motor,
wherein the control electronics are configured to drive the electric motor to close the shutter when the control electronics receive a signal from the proximity sensor indicating that an object is is approaching the electro-acoustic transducer.

11. The loudspeaker of claim 10, wherein the control electronics comprise:
a processor coupled to the proximity sensor and to the electric motor; and
instructions stored on a non-transitory computer-readable media that, when executed, cause the processor to:
drive the electric motor to close the shutter when the processor receives a signal from the proximity sensor indicating that an object is approaching the electro-acoustic transducer.

12. The loudspeaker of claim 11, wherein the instructions, when executed, cause the processor to automatically shut the electro-acoustic transducer off, such that no audio is rendered via the electro-acoustic transducer, until the shutter opens up again.

13. The loudspeaker of claim 1, wherein the shutter comprises a mechanical iris comprising a plurality of overlapping blades which are displaceable to open and close an aperture formed by the blades.

14. The loudspeaker of claim 1, wherein the loudspeaker is configured such that the shutter automatically opens when an associated audio system is powered on and automatically closes when the associated audio system is powered off.

15. The loudspeaker of claim 1, wherein the shutter is further displaceable between the second, open position and a third, open position, and wherein the loudspeaker is configured such that the shutter moves between the second, open position and the third, open position in response to changes in audio volume.

16. The loudspeaker of claim 15, wherein the loudspeaker is configured such that an aperture defined by the shutter increases in response to an increase in audio volume.

17. A vehicle audio system comprising:
a plurality of loudspeakers;
a head unit;
an audio amplifier for amplifying and filtering entertainment audio received from the head unit for distribution to a plurality of speakers positioned about the vehicle cabin,
wherein at least one of the plurality of loudspeakers is a shuttered loudspeaker comprising:
an electro-acoustic transducer for converting electrical audio signals into sound waves;
a housing supporting the electro-acoustic transducer;
a shutter supported by the housing and displaceable between a first, closed position in which the shutter substantially covers the transducer, and a second, open position in which the transducer is exposed; and a proximity detector for detecting an object approaching the electro-acoustic transducer, wherein the loudspeaker is configured to displace the shutter to the first, closed position in response to detecting the object approaching the electro-acoustic transducer.

18. The vehicle audio system of claim 17, wherein the shuttered loudspeaker is disposed on an A-pillar in a vehicle cabin.

19. The vehicle audio system of claim 17, wherein the shuttered loudspeaker further comprises:

an electric motor for driving displacement of the shutter; and a control electronics coupled to the electric motor, wherein the control electronics are configured to drive the electric motor to control displacement of the shutter in response to signals received from the audio amplifier.

20. The vehicle audio system of claim 19, wherein the control electronics comprise:

a processor coupled to the electric motor; and instructions stored on a non-transitory computer-readable media that, when executed, cause the processor to:

drive the electric motor to control displacement of the shutter in response to signals received from the audio amplifier.

21. The vehicle audio system of claim 17, wherein the shuttered loudspeaker further comprises:

an electric motor for driving displacement of the shutter; and control electronics coupled to the proximity sensor and to the electric motor, wherein the control electronics are configured to drive the electric motor to close the shutter when the control electronics receives a signal from the proximity sensor indicating that an object is near the electro-acoustic transducer.

22. The vehicle audio system of claim 21, wherein the control electronics comprise:

a processor coupled to the proximity sensor and to the electric motor; and instructions stored on a non-transitory computer-readable media that, when executed, cause the processor to:

drive the electric motor to close the shutter when the processor receives a signal from the proximity sensor indicating that an object is approaching the electro-acoustic transducer.

23. The vehicle audio system of claim 22, wherein the instructions, when executed, cause the processor to automatically shut the electro-acoustic transducer off, such that no audio is rendered via the electro-acoustic transducer, until the shutter opens up again.

24. The vehicle audio system of claim 17, wherein the shutter comprises a mechanical iris comprising a plurality of overlapping blades which are displaceable to open and close an aperture formed by the blades.

* * * * *